United States Patent
Hwang et al.

(10) Patent No.: US 8,669,586 B2
(45) Date of Patent: Mar. 11, 2014

(54) LIGHT EMITTING DEVICE, LIGHT EMITTING DEVICE PACKAGE, AND LIGHTING SYSTEM

(75) Inventors: Sung Min Hwang, Seoul (KR); Hyun Kyong Cho, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 271 days.

(21) Appl. No.: 12/908,710

(22) Filed: Oct. 20, 2010

(65) Prior Publication Data

US 2011/0095332 A1 Apr. 28, 2011

(30) Foreign Application Priority Data

Oct. 22, 2009 (KR) .................. 10-2009-0100813

(51) Int. Cl.
*H01L 33/00* (2010.01)

(52) U.S. Cl.
USPC .................................. 257/103; 257/E33.063

(58) Field of Classification Search
USPC .............. 257/76, 99, 103, E33.063, E33.025; 438/22, 46
See application file for complete search history.

(56) References Cited

U.S. PATENT DOCUMENTS

| | | | |
|---|---|---|---|
| 6,818,465 B2 | 11/2004 | Biwa et al. | |
| 8,232,566 B2 | 7/2012 | Cho et al. | |
| 2004/0048409 A1* | 3/2004 | Biwa et al. | 438/46 |
| 2005/0199887 A1* | 9/2005 | Suehiro et al. | 257/79 |
| 2005/0199888 A1* | 9/2005 | Seong et al. | 257/79 |
| 2007/0170441 A1* | 7/2007 | Takizawa et al. | 257/79 |
| 2007/0195843 A1* | 8/2007 | Tamura et al. | 372/45.01 |
| 2007/0267636 A1* | 11/2007 | Wu et al. | 257/79 |
| 2007/0292979 A1* | 12/2007 | Hata et al. | 438/22 |
| 2010/0084675 A1 | 4/2010 | Ueno et al. | |

FOREIGN PATENT DOCUMENTS

| | | |
|---|---|---|
| CN | 1476642 | 2/2004 |
| CN | 101882660 | 11/2010 |
| EP | 0977277 | 2/2000 |
| EP | 2249406 | 11/2010 |
| JP | 04-010688 A | 1/1992 |
| JP | 04-273174 A | 9/1992 |
| JP | 2655943 | 9/1997 |
| JP | 09232675 | 9/1997 |
| JP | 11145515 | 5/1999 |
| JP | 2000068593 | 3/2000 |
| JP | 2000106473 | 4/2000 |
| JP | 2004274042 | 9/2004 |
| JP | 2001036129 | 2/2012 |
| KR | 10-2009-0018451 A | 2/2009 |
| WO | WO2009/028660 | 3/2009 |

OTHER PUBLICATIONS

Kim Sun Kyung Cho Hyun Kyong, WO2009028860A2, Light Emitting Device and Method for Fabricating The Same, Mar. 5, 2009.*
Chinese Office Action dated Jul. 20, 2012.

(Continued)

*Primary Examiner* — Vongsavanh Sengdara
(74) *Attorney, Agent, or Firm* — Ked & Associates LLP

(57) ABSTRACT

A light emitting device includes a first electrode, a first semiconductor layer, an active layer; a second semiconductor layer, and a second electrode. A current blocking layer is formed on a side surface of and has a width provided within the first semiconductor layer. The thickness and width of the current blocking layer is smaller than the thickness and width of the first semiconductor layer.

19 Claims, 9 Drawing Sheets

(56) References Cited

OTHER PUBLICATIONS

European Search Report dated Jul. 27, 2012.
European Search Report for Application No. 101871853.3-222 dated Mar. 8, 2011.
Korean Office Action dated Apr. 22, 2011.
Korean Office Action dated Feb. 23, 2012.
Chinese Office Action issued in related Application No. 201010529773.0 dated Nov. 11, 2013.

* cited by examiner

LIGHT EMITTING DEVICE, LIGHT EMITTING DEVICE PACKAGE, AND LIGHTING SYSTEM

CROSS-REFERENCE TO RELATED APPLICATIONS

This application claims under 35 U.S.C. §119 to Korean Patent Application No. 10-2009-0100813 filed Oct. 22, 2009, which is hereby incorporated by reference.

BACKGROUND

1. Field

One or more embodiments described herein relate to light emission.

2. Background

A light emitting diode (LED) is a semiconductor device that converts an electrical signal into light. These devices typically have a stack structure which includes a semiconductor layer of a first conductivity type, an active layer, and a semiconductor layer of a second conductivity type. Because of their size, LEDs have proven desirable for many applications. However, improvements are still needed.

DETAILED DESCRIPTION

Figure 1:
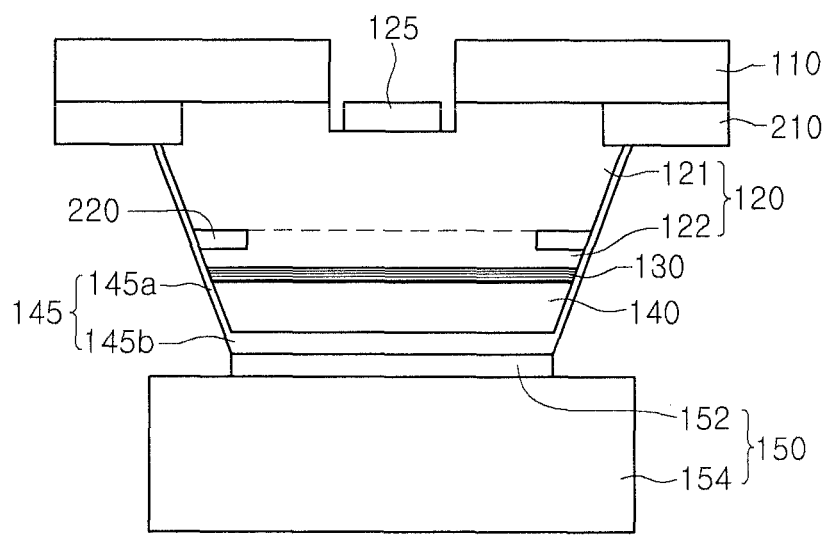
FIG. 1 is a diagram showing one embodiment of a light emitting device.

FIG. 1 shows one embodiment of a light emitting device 100 which includes a semiconductor layer 140 of a second conductivity type; an active layer 130 on semiconductor layer 140; and a semiconductor layer 120 of a first conductivity type on the active layer 130.

The first conductivity type semiconductor layer 120 may include a semiconductor layer 122 of a first conductivity type, a current blocking layer 220 disposed at an inner surface of a peripheral side of semiconductor layer 122, and a semiconductor layer 121 of a first conductivity type disposed over semiconductor layer 122. In one example, the first conductivity type may be n type and the second conductivity type may be p type.

A passivation layer 145 may be disposed over a light emitting structure including the first conductivity type semiconductor layer 120, active layer 130, and second conductivity type semiconductor layer 140, and may be formed of the same series material as the light emitting structure. For example, the passivation layer 145 may be formed of the same series or semiconductor material as the light emitting structure, or any one of a number of other known passivation materials.

The current blocking may produce several effects. For example, when the current blocking layer is formed at a partial side region of a selectively grown light emitting structure and then a re-growth is performed, current concentration on the side surface can be prevented and a device with a large light quantity can be implemented by smoothing current flow.

The passivation layer may also produce several effects. For example, when the passivation layer is formed of the same series material as the light emitting structure, the light emitting device fabrication process may be simplified. Also, the passivation layer may be formed of the same type layer as the light emitting structure to increase the contact force between the passivation layer and the light emitting structure.

Also, a selective region growth method may be used to grow a GaN-based material with a low crystal defect into a light emitting structure, thereby implementing high internal efficiency, high reliability and smooth current spreading. One embodiment of this method is explained with reference to FIGS. 2 to 6.

According to one embodiment, a light emitting device may be formed of GaN, GaAs, GrAsP or GaP. For example, a green~blue LED may be formed using GaN (InGaN) and a yellow~red LED may be formed of InGaAlP or AlGaAs. Herein, a full color may also be implemented by changing a material composition. The steps of the method will now be discussed.

Figure 2:
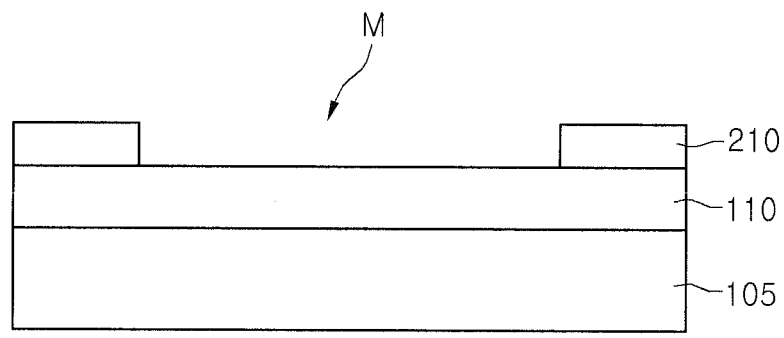
FIGS. 2 to 6 are diagrams showing different stages of manufacture of the light emitting device of FIG. 1.

As shown in FIG. 2, an undoped semiconductor layer 110 may be formed on a first substrate 105. The first substrate 105 may include a conductive substrate or a dielectric substrate. For example, the first substrate 105 may include at least one of sapphire ($Al_2O_3$), SiC, Si, GaAs, GaN, ZnO, Si, GaP, InP, Ge and $Ga_2O_3$. A roughness structure may be formed on the first substrate 105, and a wet washing process may be performed to remove the impurities of the surface of the first substrate 105.

For example, according to one non-limiting embodiment, an undoped-GaN layer may be formed on the first substrate 105. By forming the undoped semiconductor layer 110, the growth of the first conductivity type semiconductor layer 120 can be improved and a crystal defect can be prevented from extending to the top side. The formation of the nonconductive semiconductor layer 110 is optional and may be omitted.

Thereafter, a first pattern 210 is formed to expose a partial region M on the undoped semiconductor layer 110. The first pattern 210 may be left at a boundary region between chips. For example, the first pattern 210 may be an oxide layer or a nitride layer such as $SiO_2$ or $Si_3N_4$, but different materials may be used in other embodiments. For example, a PECVD process may be performed to deposit $SiO_2$ and a patterning process may be performed to form the first pattern 210 exposing the partial region M.

Figure 3A:
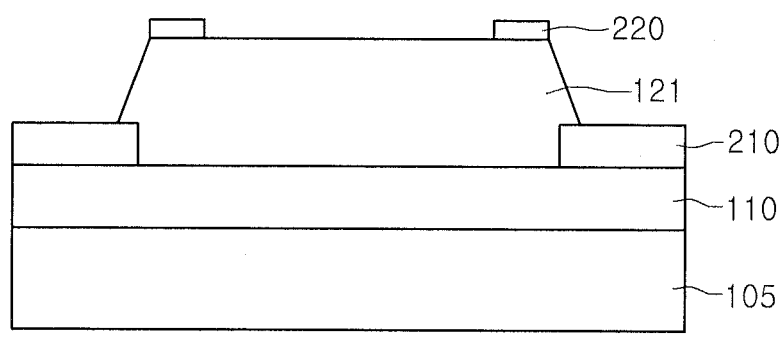
FIGS. 3B-3E are topographical views illustrating various different configurations of a current blocking layer shown in FIG. 3A.

As shown in FIG. 3A, first semiconductor layer 121 of a first conductivity type is formed on the exposed first substrate 105 or undoped semiconductor layer 110. The first conductivity type first semiconductor layer 121 may be formed, for example, of a Group III-V compound semiconductor doped with a first conductivity type dopant. If the first semiconductor layer 121 is an N-type semiconductor layer, the first conductivity type dopant may include an N-type dopant such as Si, Ge, Sn, Se or Te; however, different materials may be used in other embodiments.

According to one embodiment, the first semiconductor layer 121 may include a semiconductor material with a composition of $In_xAl_yGa_{1-x-y}N$ ($0 \le x \le 1$, $0 \le y = 1$, $0 \le x+y \le 1$). For example, the first semiconductor layer 121 may be formed of at least one of GaN, InN, AlN, InGaN, AlGaN, InAlGaN, AlInN, AlGaAs, InGaAs, AlInGaAs, GaP, AlGaP, InGaP, AlInGaP and InP.

The first semiconductor layer 121 may include an N-type GaN layer formed by chemical vapor deposition (CVD), molecular beam epitaxy (MBE), sputtering, or hydride vapor phase epitaxy (HYPE). Also, the first semiconductor layer 121 may be formed by injecting, into a chamber, trimethyl gallium (TMGa) gas, ammonia (NH$_3$) gas, nitrogen (N$_2$) gas, or silane (SiH$_4$) gas including n-type impurity such as silicon (Si).

The first semiconductor layer 121 may be also grown laterally from a seed region (e.g., exposed undoped semiconductor layer 110) to the first pattern 210 or may be grown vertically on the first substrate 105. For example, the first semiconductor layer 121 may be selectively grown vertically/horizontally along the first pattern 110 and the first substrate 105 and a threading dislocation (TD) may be bent in a horizontal growth region in the direction of the first pattern 210 or is blocked by the first pattern 210, thereby suppressing surface infiltration.

The first semiconductor layer 121 can have a high-grade crystalline structure with little dislocation. In other words, in accordance with one embodiment, a method for performing selective region growth may be used to grow a GaN-based material with a low crystal defect into an LED structure, thereby resulting in the formation of a light emitting device with high internal efficiency, high reliability and smooth current spreading.

Thereafter, a current blocking layer 220 may be formed as a second pattern at a peripheral side of a top surface of the first semiconductor layer 121. More specifically, the current blocking layer 220 may be formed at an inner surface of a peripheral side of the first semiconductor layer 121 and may include a nonconductive region, an ion implantation layer of a second conductivity type, a diffusion layer of a second conductivity type, a dielectric material, and an amorphous region.

The current blocking layer may be formed by forming a dielectric layer over the first semiconductor layer 121 and then leaving the dielectric layer at a peripheral side of the first semiconductor layer 121.

In another embodiment, the current blocking layer may be formed by forming a third pattern not illustrated) exposing a top surface of a peripheral side of the first semiconductor layer 121 and forming a dielectric material through a deposition process using the third pattern as a mask, or forming an ion implantation layer through an ion implantation process of second conductivity type ions and then removing the third pattern.

In another embodiment, protons with high kinetic energy are implanted into a top surface of a peripheral side of the first semiconductor layer 121 to break a single crystal state by a lattice collision, thereby forming an amorphous region with a high electrical resistance.

As indicated, the current blocking layer 220 may be formed at an inner surface of a peripheral side of the first semiconductor layer 121. For example, the current blocking layer 220 may be formed from the circumference or perimeter to the inner side within about 0.5% of the area of a top surface of the first semiconductor layer 121. However, the current blocking layer may be formed at a different percentage relative to the area of the top surface of layer 121 in other embodiments.

By forming a current blocking layer at a partial side region of the selectively grown n-GaN and then re-growth is performed, a current concentration on a side surface can be prevented and a device with a large light quantity can be implemented by smoothing a current flow.

FIGS. 3B-3E are topographical views illustrating various different configurations of a current blocking layer shown in FIG. 3A.

Figure 3B:
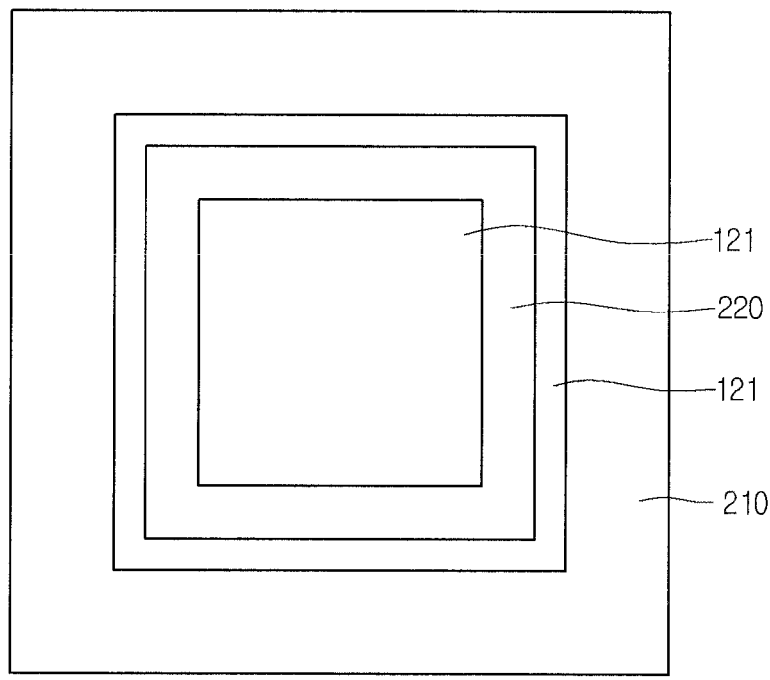
Figure 3C:
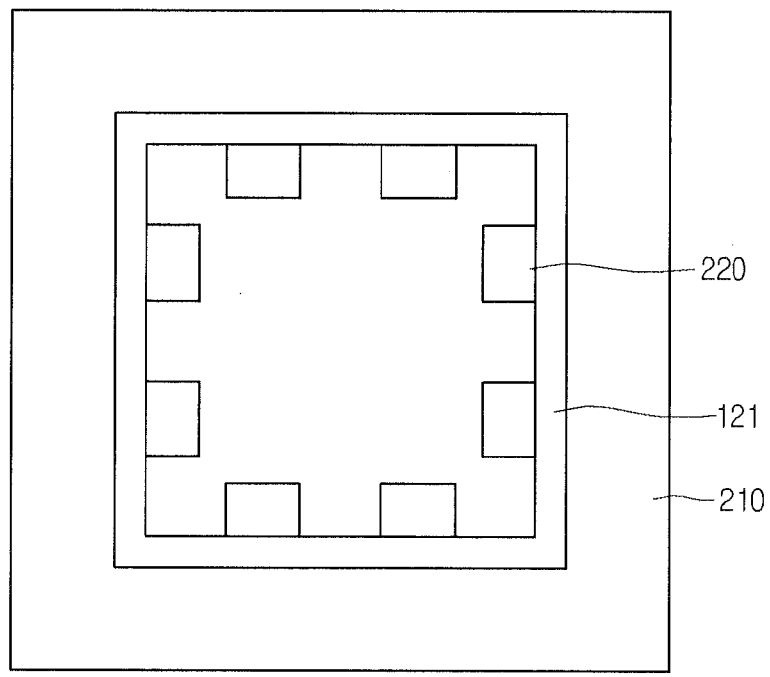
Figure 3D:
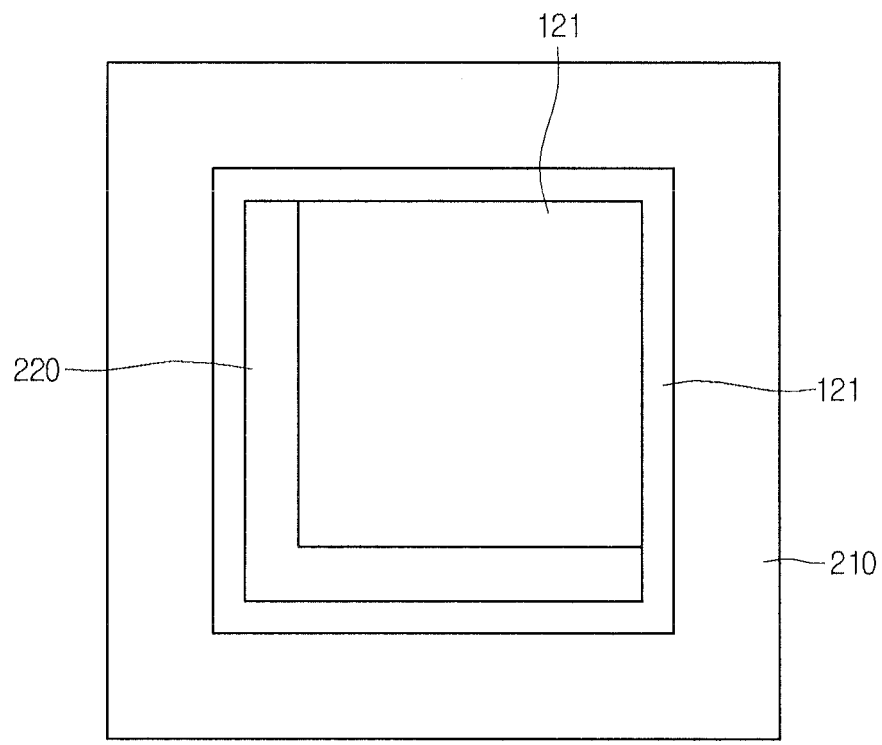
Figure 3E:
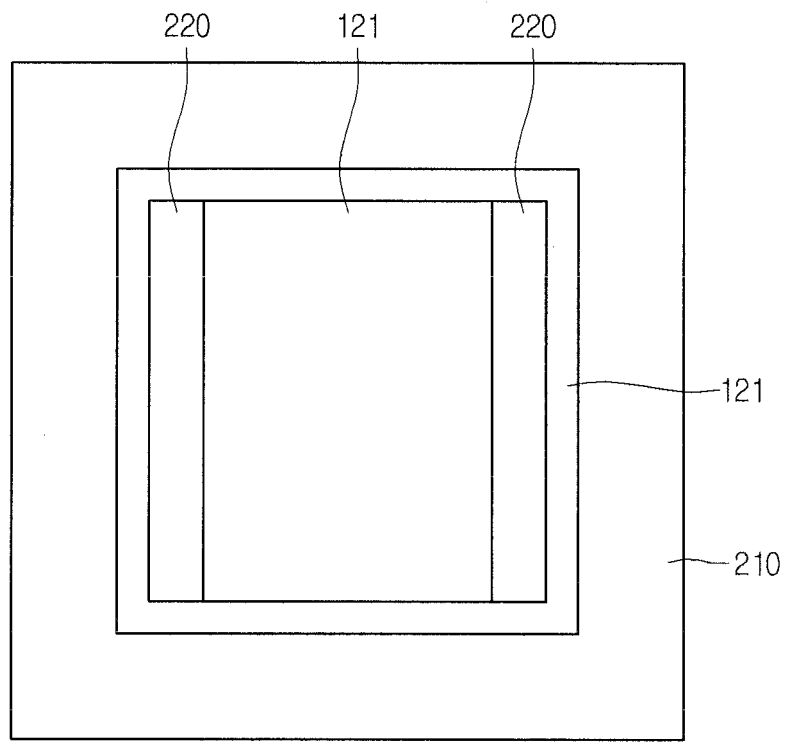

In FIG. 3B, the current blocking layer is on all four sides. In FIG. 3C, a plurality of blocking layers formed on each side. In FIG. 3D, the current blocking layer is on two adjacent sides. In FIG. 3E, the current blocking layers are formed on opposite sides.

Figure 4:
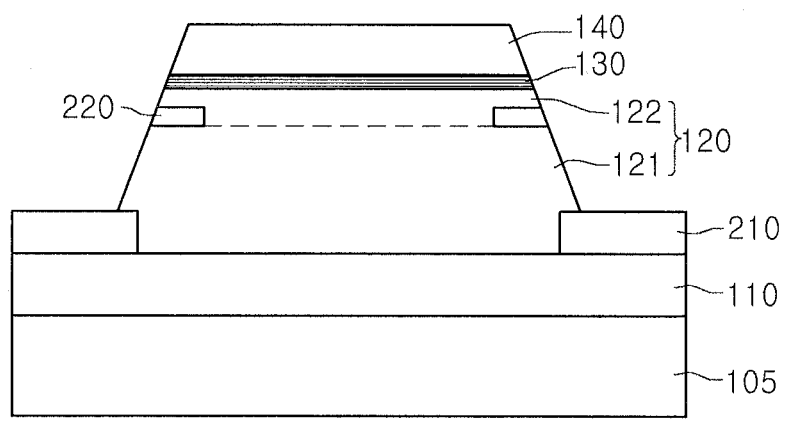

As shown in FIG. 4, a second semiconductor layer 122 of a first conductivity type is then formed on the first semiconductor layer 121. The second semiconductor layer 122 may be formed, for example, using a same or similar process as the one used to form first semiconductor layer 121.

Thereafter, an active layer 130 is formed on the second semiconductor layer 122. The active layer 130 may emit light with energy determined by the specific energy band of an active layer (a light emitting layer) when electrons injected through the first conductivity type semiconductor layer 120 recombines with holes injected through the second conductivity type semiconductor layer 140.

The active layer 130 may be formed, for example, in at least one of a single quantum well structure, a multi quantum well (MQW) structure, a quantum wire structure, or a quantum dot structure. Also, the active layer 130 may be formed in an MQW structure, for example, by injecting trimethyl gallium (TMGa) gas, ammonia (NH$_3$) gas, nitrogen (N$_2$) gas, or trimethyl indium (TMIn) gas. The active layer may be formed with different structures and/or other materials in other embodiments.

A well layer/barrier barrier of the active layer 130 may be formed in at least one pair structure of InGaN/GaN, InGaN/InGaN, AlGaN/GaN, InAlGaN/GaN, GaAs/AlGaAs (InGaAs) and GaP/AlGaP (InGaP). The well layer may be formed of a material with a band gap lower than the band gap of the barrier layer. In other embodiments, different materials may be used.

A conductive clad layer may be formed on and/or under the active layer 130. The conductive clad layer may be formed, for example, of an AlGaN-based semiconductor and may have a higher band gap than the active layer 130.

The active layer 130 may be formed on the second semiconductor layer 122 in using a variety of techniques. For example, a mask pattern (not illustrated) may be formed at a side surface of the second semiconductor layer 122 and then the active layer 130 may be formed on the second semiconductor layer 122.

Thereafter, a semiconductor layer 140 of a second conductivity type is formed on the active layer 130. The semiconductor layer 140 may include, for example, a Group III-V compound semiconductor doped with a second conductivity type dopant, which, for example, may be a semiconductor material having a composition of In$_x$Al$_y$Ga$_{1-x-y}$N ($0 \le x \le 1$, $0 \le y \le 1$, $0 \le x+y \le 1$). According to one embodiment, semiconductor layer 140 may include at least one of GaN, AlN, AlGaN, InGaN, InN, InAlGaN, AlInN, AlGaAs, GaP, GaAs, GaAsP, or AlGaInP.

If the first semiconductor layer 140 is a P-type semiconductor layer, the second conductivity type dopant may include a P-type dopant such as Mg, Zn, Ca, Sr or Ba. Also, the second conductivity type semiconductor layer 140 may be formed to have a single layer structure or a multi layer structure. Moreover, the semiconductor layer 140 may be a P-type GaN layer formed, for example, by injecting at least one of trimethyl gallium (TMGa) gas, ammonia (NH$_3$) gas, nitrogen (N$_2$) gas, or biscetyl cyclo pentadienyl magnesium ((EtCp$_2$Mg){Mg(C$_2$H$_5$C$_5$H$_4$)$_2$}) including P-type impurity such as magnesium (Mg) into a chamber. The semiconductor layer 140 may be formed using different techniques in other embodiments.

According to one embodiment, semiconductor layer 120 may be implemented by an N-type semiconductor layer and the semiconductor layer 140 may be implemented by a P-type semiconductor layer, or vice versa. Also, a semiconductor layer having an opposite conductivity type as the second conductivity type, for example, an N-type semiconductor layer (not illustrated) may be formed over the second semiconductor layer 140. Accordingly, the light emitting structure may be implemented in at least one of an N-P junction structure, a P-N junction structure, an N-P-N junction structure and a P-N-P junction structure.

According to another variation, a second current blocking layer (not illustrated) may be formed at a peripheral side of the semiconductor layer 140. When taken in combination with the current blocking layer 220, the second current blocking layer can prevent a current concentration on the side surface and can smooth a current flow, thereby implementing a device with a large light quantity.

Figure 5:
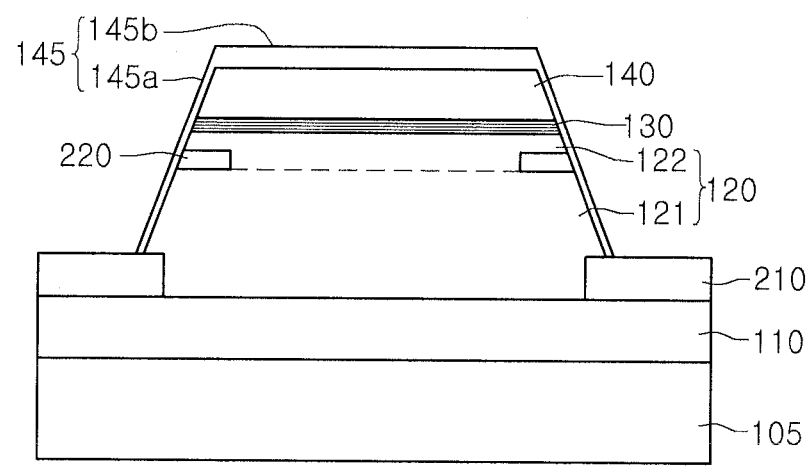

As shown in FIG. 5, a passivation layer 145 may be formed on the light emitting structure by using, for example, the same or a similar series material as the light emitting structure. For example, the passivation layer 145 may be formed using undoped Al$_x$In$_y$Ga$_{1-x-y}$N (0≤x≤1, 0≤y≤1, 0≤x+y≤1). Also, the passivation layer 145 may be formed using one or more of undoped AlN, InN, GaN, AlGaN, InGaN or AlInGaN. Different materials may be used in other embodiments.

The passivation layer 145 may be formed to cover the side surface and the top surface of the light emitting structure. Herein, a passivation layer 145a at the side surface of the light emitting structure may be thinner than the passivation layer 145b at the top surface of the light emitting structure. Accordingly, the passivation layer 145b may have a current spreading function because it has higher conductivity than the passivation layer 145a. Also, the passivation layer 145a can become a passivation layer because it is thin and resistive.

In one embodiment, the side surface of the selectively grown light emitting structure may be determined by the wurtzite structure characteristics of GaN. The side surface of the light emitting structure may include multidirectional surfaces according to the surface of the first substrate 105. The characteristics of the lateral growth may vary according to the surface energy of each surface and the stability of surface atoms. Herein, the lateral growth is suppressed by the mask patterning of the first pattern 210 to provide the wurtzite material characteristics of GaN.

For example, 1~2 bonding structures of Ga atoms of the side surface may be broken but three bonding structures of the (0001) surface may be broken. Due to these characteristics, the lateral growth may have a very low growth rate in at least one embodiment. The growth rate of the lateral growth is 1/5~1/10 of the growth rate of the (0001) surface. Accordingly, the growth of a GaN passivation layer on the side surface of the light emitting structure may form a very thin high-resistivity layer.

Forming the passivation layer 145a at the side surface can produce an electrical isolation function because of its high resistivity. For example, the passivation layer 145a may be formed to a thickness of about 100 Å or less. However, the passivation layer may have different thicknesses in other embodiments. The method may further include a process of removing a portion of the passivation layer 145b disposed at the top surface of the light emitting structure.

Figure 6:
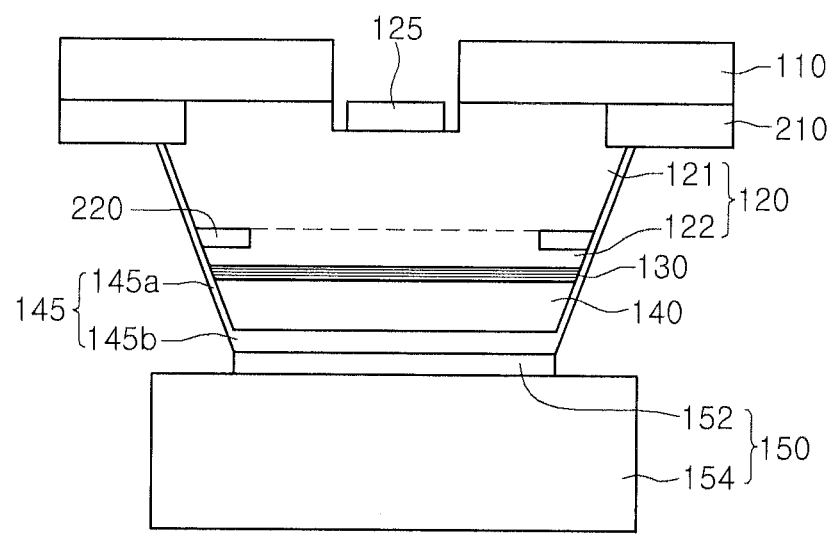

As shown in FIG. 6, a second electrode layer 150 is then formed on the semiconductor layer 140. The second electrode layer 150 may include, for example, an ohmic layer 152, a reflective layer (not illustrated), a junction layer (not illustrated), and a support substrate 154.

According to one embodiment, the second electrode layer 150 has an ohmic layer 152, and the ohmic layer 152 may make ohmic-contact with the light emitting structure to smoothly supply power to the light emitting structure, and may be formed by multi-stacking a single metal layer, a metal alloy layer, and/or a metal oxide layer.

The ohmic layer 152 may be formed including at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au or Hf. In other embodiments, different materials may be used.

The second electrode layer 150 may also include a reflective layer (not illustrated) that reflects incident light from the light emitting structure to improve light extraction efficiency. The reflective layer may be formed of metal or alloy including at least one of Ag, Ni, Al, Rh, Pd, Ir, Ru, Mg, Zn, Pt, Au or Hf. Also, the reflective layer may be formed to have a multi-layer structure using the above metal or alloy and a transparent conductive material such as at least one of IZO, IZTO, IAZO, IGZO, IGTO, AZO or ATO, e.g., a multi-layer structure of IZO/Ni, AZO/Ag, IZO/Ag/Ni and AZO/Ag/Ni.

If the second electrode layer 150 includes the junction layer, the reflective layer may function as the junction layer, or may include a barrier metal or bonding metal. For example, the junction layer may include at least one of Ti, Au, Sn, Ni, Cr, Ga, In, Bi, Cu, Ag or Ta.

The second electrode layer 150 may also include the support substrate 154. The support substrate 154 supports the light emitting structure and may supply power to the light emitting structure. The support substrate 154 may be formed of a metal, a metal alloy or a conductive semiconductor material that has superior electrical conductivity. For example, the support substrate 154 may include at least one of copper (Cu), Cu alloy, gold (Au), nickel (Ni), molybdenum (Mo), Cu—W, or a carrier wafer (e.g., Si, Ge, GaAs, GaN, ZnO, SiGe or SiC).

The thickness of the support substrate 154 may vary with a design of the light emitting device. For example, in one non-limiting embodiment, the support substrate has a thickness in the range of 30 μm to 500 μm. In addition, the support substrate 154 may be formed by an electrochemical metal deposition method, a plating method, or a bonding method using a eutectic metal.

Thereafter, the first substrate 105 is removed to expose semiconductor layer 110. The first substrate 105 may be removed by using, for example, a laser lift off method or a chemical lift off method. Also, the first substrate 105 may be removed by physically grinding the first substrate 105. A portion of the undoped semiconductor layer 110 is removed and a first electrode 125 is formed on the first conductivity type semiconductor layer 120.

As shown in FIG. 6, a light emitting device chip may be formed to have the shape of a truncated inverted pyramid (TIP), thereby providing an external quantum efficiency of about 55% or more. Also, after formation of an LED, the chip may have the shape of a truncated inverted pyramid (TIP), to thereby provide a high light-extraction effect.

According to one embodiment, the first pattern 210 may or may not be removed. If the first pattern 210 is not removed, the remaining portions of the first pattern 210 may have a side passivation function for the light emitting structure.

Figure 7:
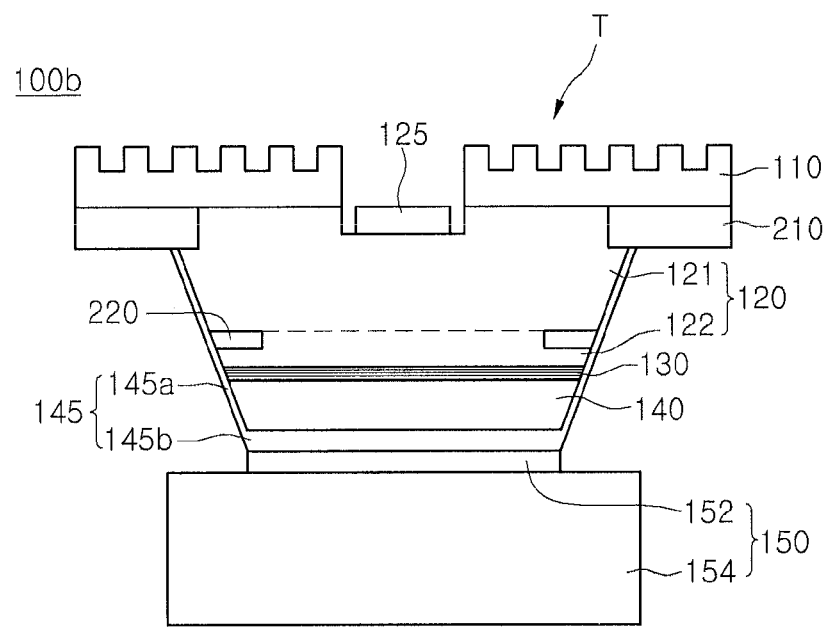
FIG. 7 is a diagram showing another embodiment of a light emitting device.

FIG. 7 shows another embodiment of a light emitting device 100b. As shown, a pattern (texture) may be formed at the undoped semiconductor layer 110 to improve the light extraction efficiency. For example, a surface roughness or photonic crystal may be formed by dry etching or wet etching a top surface of the undoped semiconductor layer 110 except a region of first electrode 125. The photonic crystal may be periodic or non-periodic.

In this device, when a current blocking layer is formed at a side partial region of the selectively grown n-GaN and then a re-growth is performed, a current concentration on a side surface can be prevented and a device with a large light quantity can be implemented by smoothing a current flow.

The passivation layer may be also formed of the same series material as the light emitting structure in order to simplify a light emitting device fabrication process. The passivation layer may be formed of the same type layer as the light emitting structure to increase the contact force between the passivation layer and the light emitting structure. A selective region growth method may be used to grow a GaN-based material with a low crystal defect into an LED structure, thereby implementing high internal efficiency, high reliability and smooth current spreading.

Figure 8:
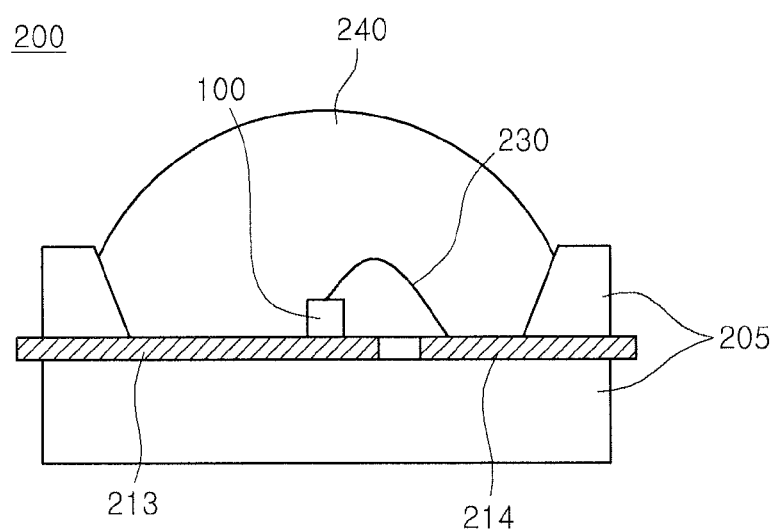
FIG. 8 is a diagram of an embodiment of a light emitting device package.

FIG. 8 shows an embodiment of a light emitting device package 200 provided with a light emitting device. The light emitting device package 200 includes a package body 205, third and fourth electrode layers 213 and 214 mounted over the package body 205, an LED 100 mounted over the package body 205 and electrically connected to the third and fourth electrode layers 213 and 214, and a molding member 240 enclosing the LED 100. The package body 205 may be formed from, for example, a silicon material, synthetic resin material, or metal material and may have an inclined surface around the LED. Further, the third electrode layer 213 and the fourth electrode layer 214 may be electrically separated and may function to supply power to the LED 100. Also, the third and fourth electrode layers 213 and 214 may reflect light generated from the LED 100 to thus increase light efficiency and may emit heat generated from the LED 100.

The LED 100 may be a vertical type LED as shown in FIG. 1 or a horizontal type LED may be applied to the light emitting device package 200. Moreover, the LED 100 may be mounted over the package body or over the third electrode layer 213 or the fourth electrode layer 214.

The LED 100 may be electrically connected to the third electrode layer 213 and/or the fourth electrode layer 214 by using any one of a variety of methods including a wire bonding method, a flip chip method, or a die bonding method. The current embodiment shows by example that the LED 100 is electrically connected to the third electrode layer 213 through a wire 230 and is electrically connected to the fourth electrode layer 214 through a direct contact with the fourth electrode layer 214.

The molding member 240 may enclose and protect the LED 100. Also, a fluorescent material may be included in the molding member 240 to change the wavelength of light emitted from the LED 100.

According to one embodiment, the light emitting device package may include a plurality of optical members such as a light guide panel, a prism sheet, a diffusion sheet, or a fluorescent sheet arranged on a path of light emitted from the light emitting device package. The light emitting device package, substrate, and optical members may function as a backlight unit or lighting unit, and a lighting system may include, for example, a backlight unit, a lighting unit, an indicator unit, a lamp, a streetlamp, or other types of lights or lighting devices.

Figure 9:
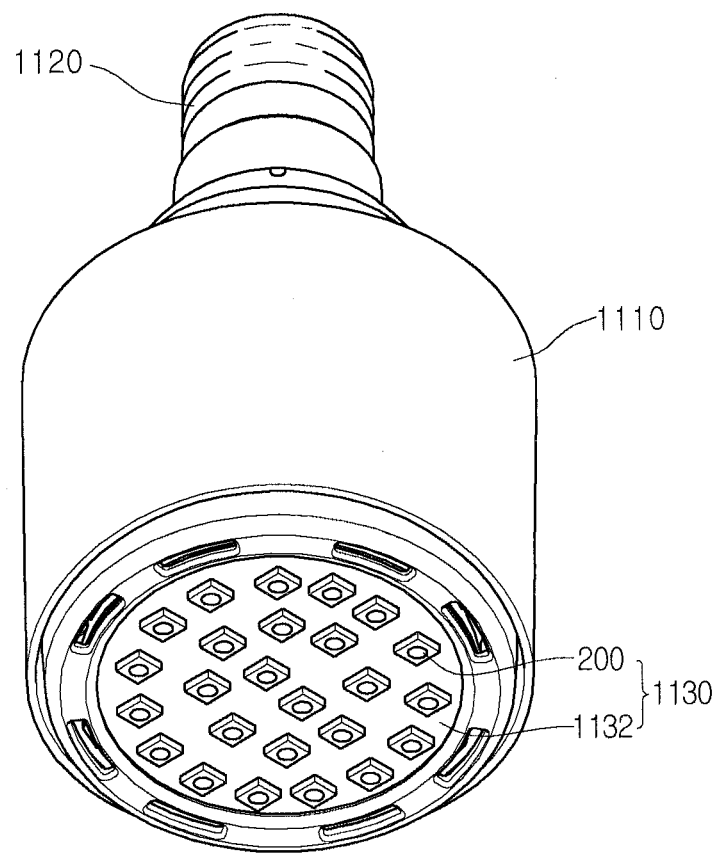
FIG. 9 is a diagram showing an embodiment of a lighting unit.

FIG. 9 shows one example of a lighting unit 1100 which includes a case body 1110, a light emitting module part 1130 equipped in the case body 1110, and a connection terminal 1120 in the case body 1110 and supplied with an electric power from an external power supply. The case body 110 may be formed, for example, of a material having good heat shielding characteristics such as but not limited to a metal material or a resin material.

The light emitting module part 1130 may include a substrate 1132 and at least one light emitting device package 200 mounted on the substrate 1132.

The substrate 1132 may be an insulator substrate on which a circuit pattern is printed and may include, for example, a general printed circuit board (PCB), a metal core PCB, a flexible PCB, a ceramic PCB, etc.

Also, the substrate 1132 may be formed of a material to efficiently reflect light and a surface thereof may be formed in a color capable of efficiently reflecting light, for example, white color, or silver color.

The at least one light emitting device packages 200 may be mounted on the substrate 1132. Each of the light emitting device packages 200 may include one or more light emitting diodes (LEDs) 100 which may include one or more color LEDs emitting red, green, blue and/or white light and/or a UV LED emitting ultraviolet (UV).

The light emitting module part 1130 may have a combination of several LEDs to obtain a desired color and luminance. For example, the light emitting module part 1130 may have a combination of a white LED, a red LED, and a green LED so as to obtain a high color rendering index (CRI).

The connection terminal 1120 may be electrically connected to the light emitting module part 1130 to supply power. As shown in FIG. 9, the connection terminal 1120 may be screwed and coupled to an external power in a socket type, but the present disclosure is not limited thereto. For example, the connection terminal 1120 may be made in a pin type and inserted into an external power, or may be connected to the external power through a power line.

Figure 10:
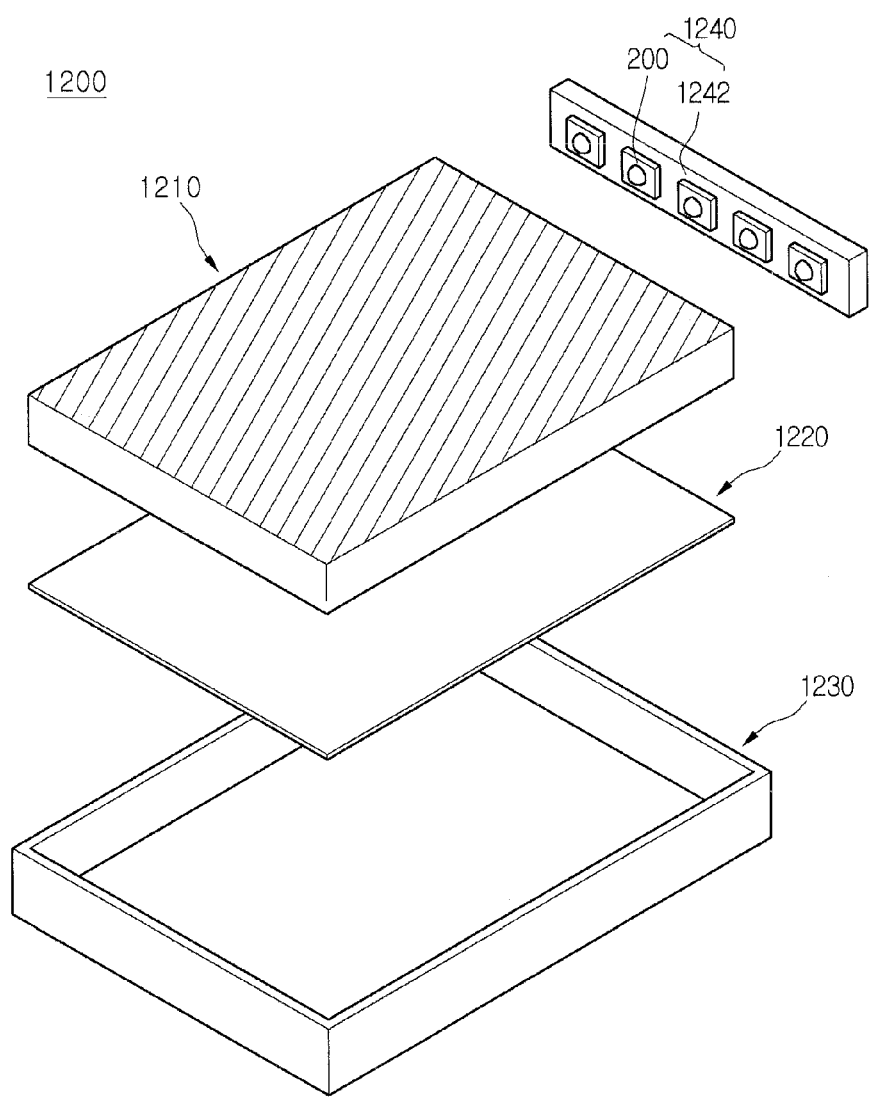
FIG. 10 is diagram showing an embodiment of a backlight unit.

FIG. 10 shows an embodiment of a backlight unit 1200 which includes a light guide panel 1210, a light emitting module part 1240 supplying light to the light guide panel 1210, a reflective member 1220 below the light guide panel 1210, and a bottom cover 1230 receiving the light guide panel 1210, the light emitting module part 1240, and the reflective member 1220, but the present disclosure is not limited thereto.

The light guide panel 1210 functions to transform linear light to planar light by diffusing the linear light. The light guide panel may include one of acryl-series resin such as polymethyl metaacrylate (PMMA), polyethylene terephthlate (PET), poly carbonate (PC), COC, or polyethylene naphthalate resin.

The light emitting module part 1240 provides light to at least a side surface of the light guide panel 1210 and finally acts as a light source of a display device in which the backlight unit is equipped.

The light emitting module part 1240 may contact the light guide panel 1210. More specifically, the light emitting module part 1240 may include a substrate 1242 and a plurality of light emitting device packages 200 mounted on the substrate 1242. The substrate 1242 may or may not contact the light guide panel 1210.

The substrate 1242 may be a PCB including a circuit pattern (not shown). The substrate 1242 may include a metal core PCB (MCPCB), a flexible PCB (FPCB), or a general or another type of PCB.

The plurality of light emitting device packages 200 may be mounted over the substrate 1242 so that light emitting surfaces of the plurality of light emitting device packages 200 are spaced apart by a predetermined distance from the light guide panel 1210.

The reflective member 1220 may be provided below the light guide panel 1210. The reflective member 1220 reflects light incident from a bottom surface of the light guide panel to allow the reflected light to be directed toward an upper direction, thereby capable of enhancing brightness of the backlight unit. The reflective member 1220 may be formed of, for example, PET, PC, PVC resin, or another material.

The bottom cover 1230 may receive the light guide panel 1210, the light emitting module part 1240, and/or the reflective member 1220. For this purpose, the bottom cover 1230 may be formed in a box shape a top surface of which is opened, however other shapes may be used in other embodiments.

The bottom cover 1230 may be formed of a metal or resin material and may be manufactured by using a process such as a press molding or an injection molding.

One or more embodiments described herein, thus, provide a light emitting device, a light emitting device package, and a lighting system which can prevent current concentration on a side surface thereof. These embodiments may also provide a light emitting device, a light emitting device package, and a lighting system, which include a passivation layer having a good contact force with respect to a light emitting structure. These embodiments may also have a low crystal defect.

According to one embodiment, a light emitting device comprises a second conductivity type semiconductor layer; an active layer on the second conductivity type semiconductor layer; and a first conductivity type semiconductor layer disposed on the active layer while including a current blocking layer at a periphery side thereof.

According to another embodiment, a light emitting device comprises a light emitting structure comprising a current blocking layer at a periphery side thereof; and a passivation layer disposed over the light emitting structure and formed of the same series material as the light emitting structure.

According to another embodiment, a light emitting device comprises a light emitting structure comprising a first conductivity type semiconductor layer, an active layer and a second conductivity type semiconductor layer; and a passivation layer disposed over the light emitting structure and formed of the same series material as the light emitting structure.

According to another embodiment, a light emitting device package comprises a package body; a third electrode layer and a fourth electrode layer disposed in the package body; and the above light emitting device electrically connected to the third electrode layer and the fourth electrode layer.

According to another embodiment, a lighting system comprises a light emitting module comprising a substrate and a light emitting device package disposed over the substrate, wherein the light emitting device package comprises: a package body; a third electrode layer and a fourth electrode layer disposed in the package body; and the above light emitting device electrically connected to the third and fourth electrode layers.

According to another embodiment, a light emitting device comprises: a first electrode; a first semiconductor layer provided adjacent to first electrode, the first semiconductor layer having a prescribed first thickness in a first direction and a prescribed first width in a second direction, the first and second directions being different, the first semiconductor layer further including side surfaces; an active layer provided adjacent to the first semiconductor layer; a second semiconductor layer provided adjacent to the active layer; and a second electrode adjacent to the second semiconductor layer.

The light emitting device further includes at least one current blocking layer at at least one side surface of the first semiconductor layer, the at least one current block layer having a second prescribed thickness in the first direction and a second prescribed width in second direction, the second prescribed thickness and the second prescribed width being smaller than the first prescribed thickness and the first prescribed width, respectively, and the entire second prescribed width of the at least one current blocking layer is provided within the first semiconductor layer.

The first semiconductor layer is of a first conductivity type and the second semiconductor layer is of a second semiconductor type. The first semiconductor layer may include a second semiconductor sub-layer of the first conductivity type, a current blocking layer at a peripheral side of the second semiconductor sub-layer, and a first semiconductor sub-layer of the first conductivity type over the second semiconductor sub-layer.

The current blocking layer may comprise at least one of a nonconductive region, a ion implantation layer of the second conductivity type, a diffusion layer of the second conductivity type, a dielectric material, and an amorphous region.

In addition, a second current blocking layer may be included at a side of the second semiconductor layer, and a cover layer may be disposed over side surfaces of the first semiconductor layer, the active layer and the second semiconductor layer and between the second semiconductor layer and the second electrode. The cover layer may be formed from a semiconductor material compound of a material used to form at least one of the first semiconductor layer, the active layer or the second semiconductor layer.

Also, a portion of the cover layer provided on the side surfaces may have a smaller thickness than a portion provided between the second semiconductor layer and the second electrode, such that the portion of the cover layer provided on the side surfaces serves as a passivation layer.

Moreover, a portion of the cover layer provided on the side surfaces may have a smaller thickness than a portion provided between the second semiconductor layer and the second electrode, such that the portion of the cover layer provided on the side surfaces has a higher resistance than the portion of the cover layer provided between the second semiconductor layer and the second electrode. Also, the cover layer may comprise undoped $Al_xIn_yGa_{1-x-y}N$ ($0 \leq x \leq 1$, $0 \leq y \leq 1$, $0 \leq x+y \leq 1$).

In addition, a passivation layer may be included at a side surface of the light emitting structure is thinner than the passivation layer at a top surface of the light emitting structure. Also, the device may include an undoped semiconductor layer adjacent the first semiconductor layer; and a recess that extends through the undoped semiconductor layer and penetrates into the first semiconductor layer, the first electrode located within the recess.

The undoped semiconductor layer has a first surface and an opposing second surface, wherein the first surface is closer to the first semiconductor layer and the second surface and wherein the second surface includes a plurality of spaced raised portions.

According to another embodiment, a light emitting device package comprises a package body; a first electrode layer and a second electrode layer in the package body; and a light emitting device according to claim 1 electrically coupled to the first and second electrode layers.

According to another embodiment, a lighting system comprises a light emitting module comprising a substrate and a light emitting device package disposed over the substrate, wherein the light emitting device package comprises: a package body; a first electrode layer and a second electrode layer in the package body; and a light emitting device according to claim 1 electrically coupled to the first and second electrode layers.

In the description of the embodiments, it will be understood that when a layer (or film) is referred to as being 'on' another layer or substrate, it can be directly on another layer or substrate, or intervening layers may also be present.

Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. The features of any one embodiment may be combined with the features of one or more of the remaining embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first electrode;
   a first semiconductor layer provided adjacent to first electrode, the first semiconductor layer having a prescribed first thickness in a first direction and a prescribed first width in a second direction, the first and second directions being different, the first semiconductor layer further including side surfaces;
   an active layer provided adjacent to the first semiconductor layer;
   a second semiconductor layer provided adjacent to the active layer;
   a second electrode adjacent to the second semiconductor layer;
   at least one current blocking layer at at least one side surface of the first semiconductor layer, the at least one current block layer having a second prescribed thickness in the first direction and a second prescribed width in second direction, the second prescribed thickness and the second prescribed width being smaller than the first prescribed thickness and the first prescribed width, respectively, and the entire second prescribed width of the at least one current blocking layer is provided within the first semiconductor layer;
   a second current blocking layer at a side of the second semiconductor layer; and
   a cover layer disposed over side surfaces of the first semiconductor layer, the active layer and the second semiconductor layer and between the second semiconductor layer and the second electrode,
   wherein the cover layer comprises a semiconductor material same as a material of at least one of the first semiconductor layer, the active layer or the second semiconductor layer.

2. The light emitting device of claim 1, wherein the first semiconductor layer is of a first conductivity type and the second semiconductor layer is of a second semiconductor type.

3. The light emitting device of claim 2, wherein the first semiconductor layer comprises:
   a second semiconductor sub-layer of the first conductivity type;
   the current blocking layer at a peripheral side of the second semiconductor sub-layer; and
   a first semiconductor sub-layer of the first conductivity type over the second semiconductor sub-layer.

4. The light emitting device of claim 2, wherein the current blocking layer comprises at least one of a nonconductive region, a ion implantation layer of the second conductivity type, a diffusion layer of the second conductivity type, a dielectric material, and an amorphous region.

5. The light emitting device of claim 1, wherein a portion of the cover layer provided on the side surfaces has a smaller thickness than a portion provided between the second semiconductor layer and the second electrode, such that the portion of the cover layer provided on the side surfaces serves as a passivation layer.

6. The light emitting device of claim 5, wherein the portion of the cover layer on the side surfaces has a thickness of about 100 Å or less.

7. The light emitting device of claim 1, wherein a portion of the cover layer provided on the side surfaces has a smaller thickness than a portion provided between the second semiconductor layer and the second electrode, such that the portion of the cover layer provided on the side surfaces has a higher resistance than the portion of the cover layer provided between the second semiconductor layer and the second electrode.

8. The light emitting device of claim 1, wherein the first conductivity type semiconductor layer, the active layer, and the second conductivity type semiconductor layer compose a light emitting structure, and wherein the cover layer at a side surface of the light emitting structure is thinner than the cover layer at a top surface of the light emitting structure.

9. A light emitting device package having the light emitting device of claim 1, wherein the light emitting device package further comprising:
   a package body;
   a first electrode layer and a second electrode layer in the package body, wherein the light emitting device is electrically coupled to the first and second electrode layers.

10. A lighting system having the light emitting device of claim 1, the lighting system further comprising:
    a light emitting module comprising a substrate and a light emitting device package disposed over the substrate, wherein the light emitting device package includes a package body, and a first electrode layer and a second electrode layer in the package body, wherein the light emitting device is electrically coupled to the first and second electrode layers.

11. The light emitting device of claim 1, wherein the first conductivity type semiconductor layer, the active layer, and the second conductivity type semiconductor layer compose a light emitting structure, and wherein the light emitting structure comprises a wurtzite structure of GaN type.

12. The light emitting device of claim 1, wherein the current blocking layer has a plurality of patterns being apart from each other.

13. The light emitting device of claim 12, wherein the plurality of current blocking layer patterns have a rectangular cross-section formed on each of the four sides of the first semiconductor layer.

14. The light emitting device of claim 1, wherein the cover layer comprises a second portion inter-disposed between the second electrode and the second semiconductor layer.

15. The light emitting device of claim 14, wherein the second portion of the cover layer contacts with all bottom surface of the second semiconductor layer.

16. The light emitting device of claim 14, wherein the cover layer comprises a first portion disposed on the side surfaces of the first semiconductor layer, the active layer and the second semiconductor layer, and
wherein a first thickness of the first portion with respect a vertical direction of a top surface of the first portion is smaller than a second thickness of the second portion with respect a vertical direction of a top surface of the second portion.

17. A light emitting device comprising:
a first electrode;
a first semiconductor layer provided adjacent to first electrode, the first semiconductor layer having a prescribed first thickness in a first direction and a prescribed first width in a second direction, the first and second directions being different, the first semiconductor layer further including side surfaces;
an active layer provided adjacent to the first semiconductor layer;
a second semiconductor layer provided adjacent to the active layer;
second electrode adjacent to the second semiconductor layer;
at least one current blocking layer at least one side surface of the first semiconductor layer, the at least one current block layer having a second prescribed thickness in the first direction and a second prescribed width in second direction, the second prescribed thickness and the second prescribed width being smaller than the first prescribed thickness and the first prescribed width, respectively, and the entire second prescribed width of the at least one current blocking layer is provided within the first semiconductor layer; and
a cover layer disposed over side surfaces of the first semiconductor layer, the active layer and the second semiconductor layer and between the second semiconductor layer and the second electrode,
wherein the cover layer comprises a semiconductor material same as a material of at least one of the first semiconductor layer, the active layer or the second semiconductor layer, and
wherein the cover layer comprises undoped $Al_xIn_yGa_{1-x-y}N$ ($0 \leq x \leq 1$, $0 \leq y \leq 1$, $0 \leq x+y \leq 1$).

18. A light emitting device comprising:
a first electrode;
a first semiconductor layer provided adjacent to first electrode, the first semiconductor layer having a prescribed first thickness in a first direction and a prescribed first width in a second direction, the first and second directions being different, the first semiconductor layer further including side surfaces;
an active layer provided adjacent to the first semiconductor layer;
a second semiconductor layer provided adjacent to the active layer;
a second electrode adjacent to the second semiconductor layer;
at least one current blocking layer at least one side surface of the first semiconductor layer, the at least one current block layer having a second prescribed thickness in the first direction and a second prescribed width in second direction, the second prescribed thickness and the second prescribed width being smaller than the first prescribed thickness and the first prescribed width, respectively, and the entire second prescribed width of the at least one current blocking layer is provided within the first semiconductor layer;
a cover layer disposed over side surfaces of the first semiconductor layer, the active layer and the second semiconductor layer and between the second semiconductor layer and the second electrode;
an undoped semiconductor layer adjacent the first semiconductor layer; and
a recess that extends through the undoped semiconductor layer and penetrates into the first semiconductor layer, the first electrode located within the recess,
wherein the cover layer comprises a semiconductor material same as a material of at least one of the first semiconductor layer, the active layer or the second semiconductor layer.

19. The light emitting device of claim 18, wherein the undoped semiconductor layer has a first surface and an opposing second surface, wherein the first surface is closer to the first semiconductor layer and the second surface and wherein the second surface includes a plurality of spaced raised portions.

* * * * *